United States Patent
Tolt

[11] Patent Number: 5,869,922
[45] Date of Patent: Feb. 9, 1999

[54] CARBON FILM FOR FIELD EMISSION DEVICES

[75] Inventor: Zhidan Li Tolt, Austin, Tex.

[73] Assignee: SI Diamond Technology, Inc., Austin, Tex.

[21] Appl. No.: 910,604

[22] Filed: Aug. 13, 1997

[51] Int. Cl.⁶ ........................................................ H01J 1/05
[52] U.S. Cl. .............................................................. 313/310
[58] Field of Search ..................... 313/309, 310, 313/311, 336, 351, 495

*Primary Examiner*—Vip Patel
*Attorney, Agent, or Firm*—Kelly K. Kordzik; Winstead Sechrest & Minick P.C.

[57] ABSTRACT

A carbon film used for a field emission cathode comprises a layer of thin carbon film on a substrate. With 244 nm and 2–7 mW excitation, and within the wave number from 1100 to 1850 $cm^{-1}$, the carbon film has a distinct UV Raman band in the range from 1578 $cm^{-1}$ to 1620 $cm^{-1}$ with a full width at half maximum from 25 to 165 $cm^{-1}$. The carbon film can be deposited by chemical vapor deposition, physical vapor deposition, electrolysis, printing or painting, and can be continuous or noncontinuous.

10 Claims, 7 Drawing Sheets

CARBON FILM FOR FIELD EMISSION DEVICES

TECHNICAL FIELD

The present invention relates in general to field emission devices, and in particular, to a carbon emission film exhibiting certain characteristics.

BACKGROUND INFORMATION

Field emission devices show promise for enabling simpler and more efficient field emission devices, such as flat panel displays and other types of display systems where simplicity of manufacture is desired. Field emission devices that utilize flat cathodes are preferred over cathodes requiring micro-tip type structures. Therefore, there is a need in the art for better and more efficient field emission materials, which are practical for using in such flat cathodes.

SUMMARY OF THE INVENTION

The present invention provides a field emission film for use in manufacturing a flat cathode, which exhibits certain physical characteristics. With 244 nanometers ("nm") and a 2–7 milliwatts ("mW") excitation source, and within the wave number from 1100 to 1850 $cm^{-1}$, the carbon film has a distinct ultraviolet ("UV") Raman band in the range from 1578 to 1620 $cm^{-1}$ with a fill width at half maximum ("FWHM") from 25 to 165 $cm^{-1}$. There can be another less significant line in the range from 1318 to 1340 $cm^{-1}$ with a FWHM at least 18 $cm^{-1}$. Additionally, there is sometimes a wide band (FWHM>180 $cm^{-1}$) between 1360 and 1420 $cm^{-1}$. This wide band can appear as either a separate band or as a shoulder of the excitation line near 1580 $cm^{-1}$. In the visible Raman, these films exhibit the carbon DIG pair bands around 1350 $cm^{-1}$ and 1580 $cm^{-1}$, respectively.

The carbon film may be thinner than 300 nanometers. The substrate on which the film is deposited can be conductive or non-conductive. In the case of a non-conductive substrate, the substrate can be coated either with a continuous conductive layer or a fine network of conductive material.

The carbon layer can be deposited by chemical vapor deposition, physical vapor deposition, electrolysis, printing or painting. The film can be continuous or non-continuous, with a dense array of particles, each having a size less than 300 nanometers.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Figure 7:
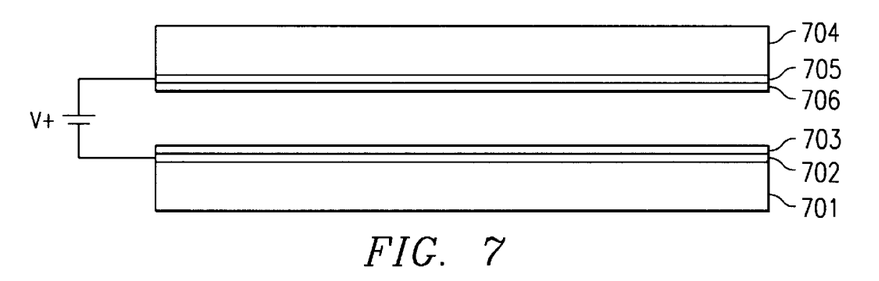
FIG. 7 illustrates a field emission device incorporating the present invention.

Referring to FIG. 7, there is illustrated a field emission device manufactured with a carbon film 703 in accordance with the present invention. On substrate 701, conductive layer 702 is deposited and carbon layer 703 is deposited on top thereof. The anode includes substrate 704, which may be a glass substrate, conductive layer 705, which may be indium-tin oxide, and a phosphor layer 706 for receiving electrons emitted from carbon layer 703. Electrons are emitted from layer 703 in response to an appropriate electric field between the anode and the cathode. The apparatus in FIG. 7 is illustrated as a diode structure, but one or more grids may be included. The apparatus may be used to produce a field emission lamp or a matrix-addressable color display. For further discussion of such configurations, please refer to U.S. Pat. Nos. 5,449,970 and 5,548,185, which are hereby incorporated by reference herein.

Figure 8:
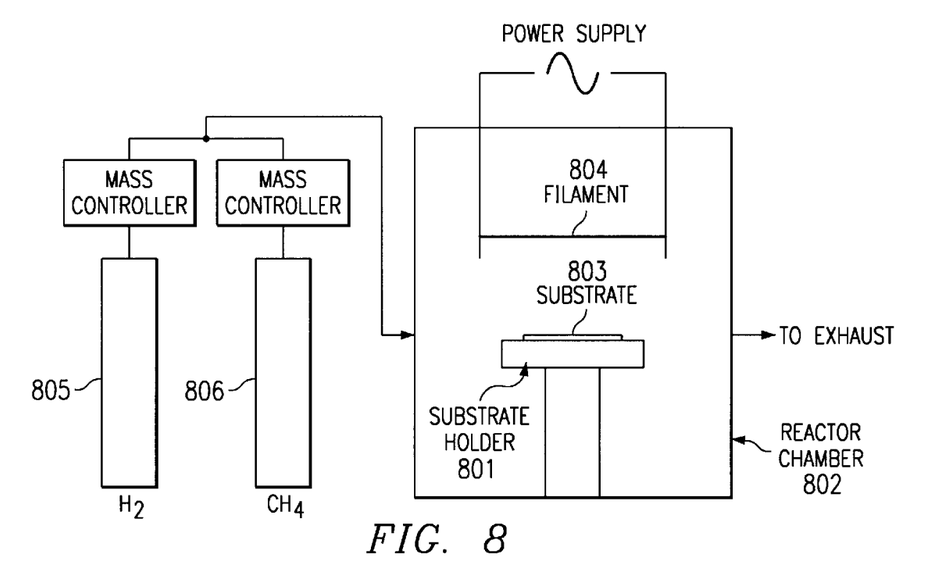
FIG. 8 illustrates an apparatus for depositing the carbon film of the present invention.

Referring to FIG. 8, the carbon layer 703 may be deposited using a hot filament assisted chemical vapor deposition ("CVD") process. The substrate 803 (optionally with the conductive layer 702 deposited thereon) is placed on a holder 801 in a CVD reactor 802. A hydrogen gas 805 is flowed into the reactor 802 for approximately less than 10 minutes. Then a hydrogen 805 and methane 806 mixture with the methane percentage less than 50% is flowed into the reactor 802 for less than one hour. Another hydrogen 805 and methane 806 mixture with the methane percentage lower than in the above step is flowed into the reactor 802 for less than two hours. Then, a hydrogen 805 flow for less than 15 minutes is performed within the CVD reactor 802.

A small amount of oxygen, nitrogen, or boron dopant can also be included in the above gas flow.

The filament 804 temperature is set in the range from 1600° C. to 2400° C. and the substrate 803 temperature is between 600° C. and 1000° C. Deposition pressure is between 5–300 torr.

The carbon film that results from this process exhibits superior emission qualities to those of prior art diamond-like carbon or CVD diamond films. A UV Raman spectrum was measured on three samples of carbon films deposited in the manner set forth above. With a 244 nm and 2–7 mW excitation source, and within the frequency from 1100 $cm^{-1}$ to 1850 $cm^{-1}$, the carbon film produced in the manner above has a distinct UV Raman band in the range from 1578 $cm^{-1}$ to 1620 $cm^{-1}$ with a FWHM from 25 to 165 $cm^{-1}$. There may also be another less significant line in the range from 1318 to 1340 $cm^{-1}$ with a FWHM greater than 18 $cm^{-1}$. Between 1360 to 1410 $cm^{-1}$, there is, sometimes, also a band with a FWHM greater than 180 $cm^{-1}$.

Though the carbon layer described above was deposited using a hot filament assisted CVD process, the carbon layer may also be deposited using physical vapor deposition, electrolysis, printing, or painting. The carbon film can be continuous or noncontinuous, and may have a dense array of particles each having a size less than 300 nanometers.

Figure 1:
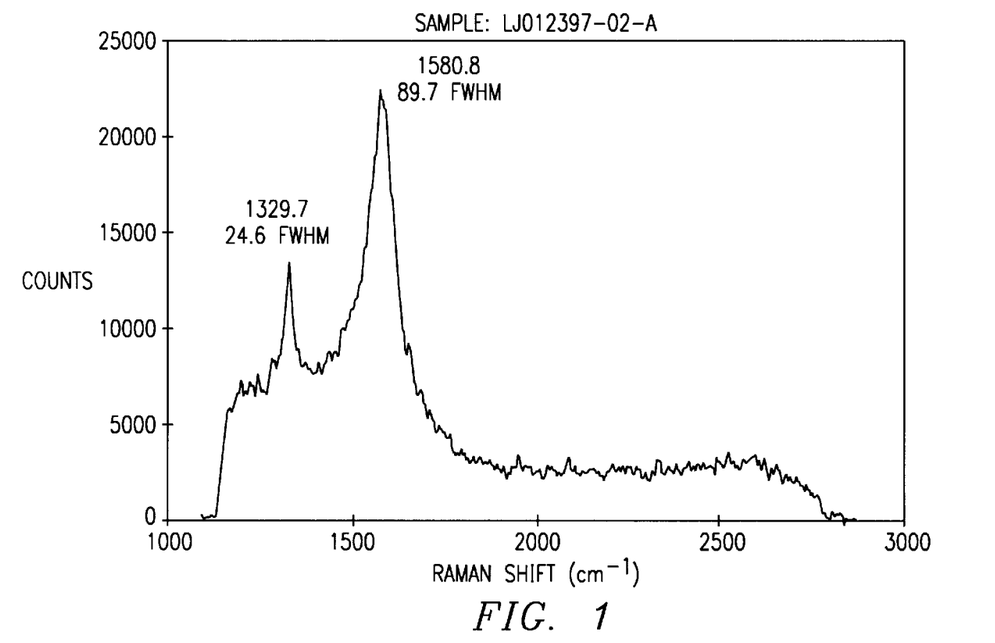
FIG. 1 illustrates a UV Raman spectrum of a sample cathode of the present invention.

As noted above, three samples of the carbon film were deposited in the manner described above. A Raman spectrum on the first sample is shown in FIG. 1 having a distinct UV Raman band at 1580.8 $cm^{-1}$ with an 89.7 $cm^{-1}$ FWHM. There is a much less significant line at 1329.7 $cm^{-1}$ with a 24.6 $cm^{-1}$ FWHM.

Figure 2:
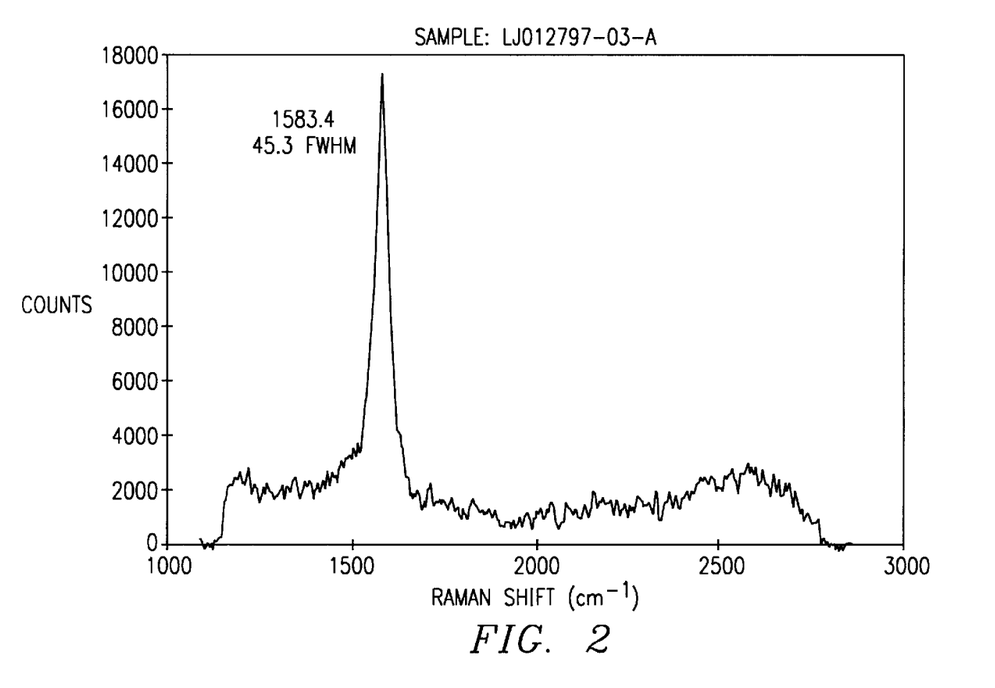
FIG. 2 illustrates a UV Raman spectrum of another sample cathode of the present invention.

A second sample of carbon layer was tested for its UV Raman spectra, which is illustrated in FIG. 2. This sample exhibited a UV Raman band at 1583.4 $cm^{-1}$ with a 45.3 $cm^{-1}$ FWHM.

Figure 3:
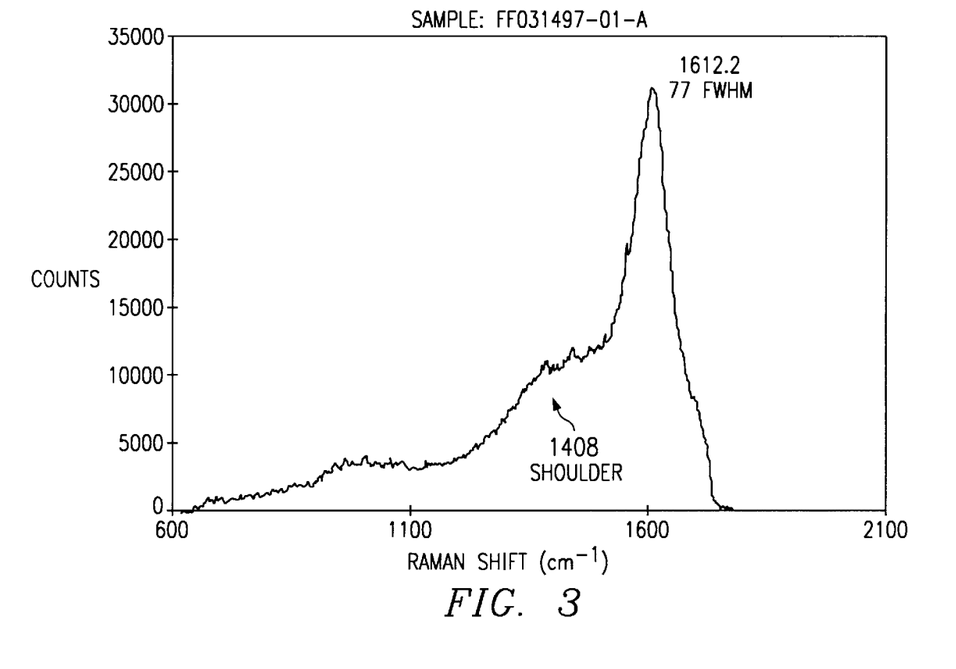
FIG. 3 illustrates another UV Raman spectrum of a sample cathode in accordance with the present invention.

A third carbon layer sample was measured for its UV Raman spectra as illustrated in FIG. 3. This carbon layer had a distinct UV Raman band at 1612.2 $cm^{-1}$ with a 77 $cm^{-1}$ FWHM. This film also exhibited a shoulder at 1408 $cm^{-1}$.

Figure 4:
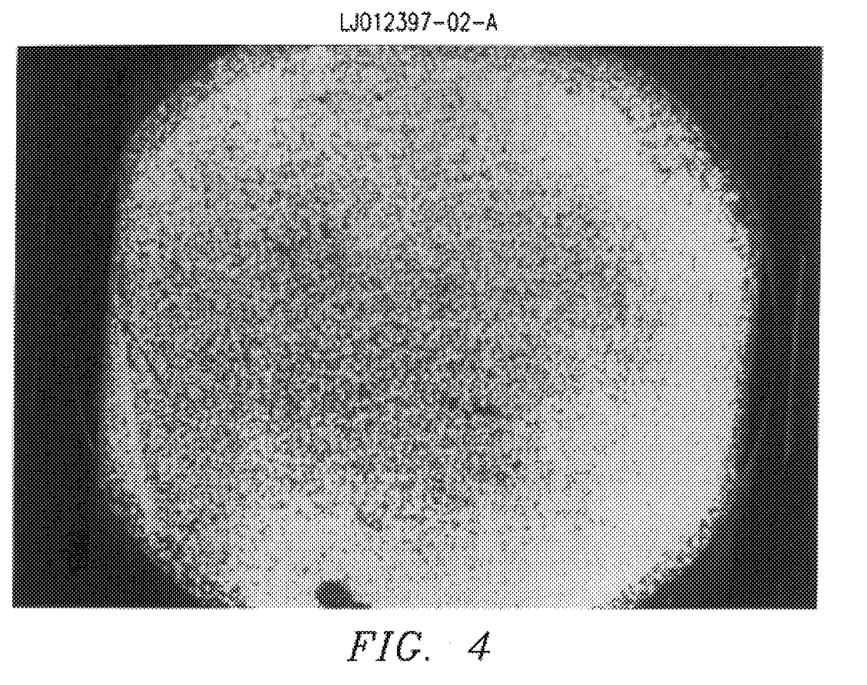
FIG. 4 illustrates a phosphor screen image of the emitting carbon film whose UV Raman spectrum is illustrated in FIG. 1.
Figure 5:
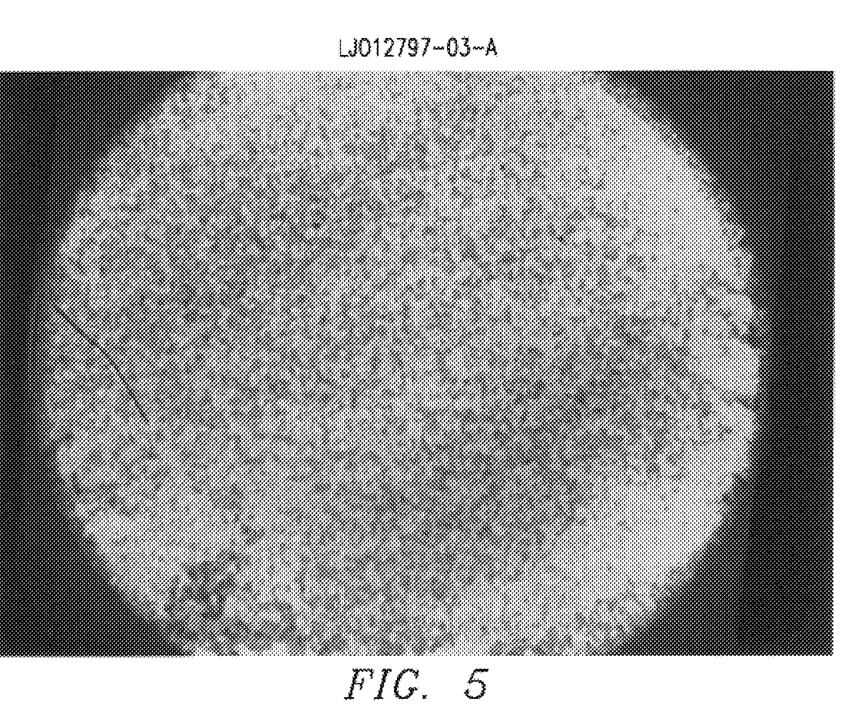
FIG. 5 illustrates a phosphor screen image of the emitting carbon film whose UV Raman spectrum is illustrated in FIG. 2.
Figure 6:
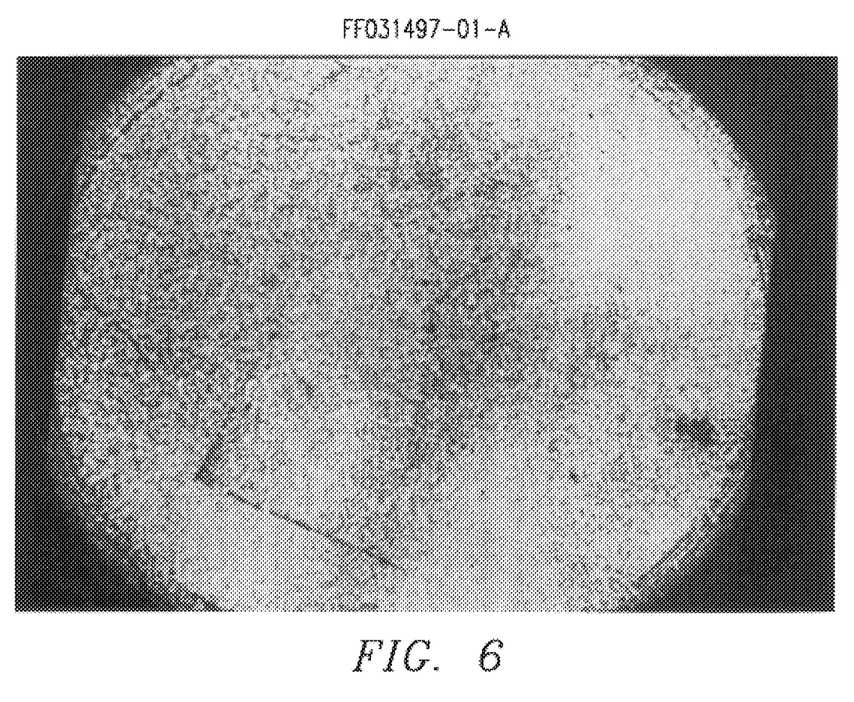
FIG. 6 illustrates a phosphor screen image of the emitting carbon film whose UV Raman spectrum is illustrated in FIG. 3.

FIGS. 4–6 illustrate photographs of phosphor screen images of the three carbon film samples illustrated in FIGS. 1–3, respectively. These screen images were produced by a field emission device similar to that illustrated in FIG. 7. The phosphor screen image in FIG. 4, pertaining to the Raman spectra illustrated in FIG. 1, was produced with a 5.3 volts per micrometer electric field.

The phosphor screen image illustrated in FIG. 5, pertaining to the UV Raman spectra illustrated in FIG. 2, was produced with a 6.3 volts per micrometer electric field.

The phosphor screen image illustrated in FIG. 6, pertaining to the UV Raman spectra illustrated in FIG. 3, was produced with a 5.7 volts per micrometer electric field.

The carbon film of the present invention is thin (less than 300 nanometers) and consists of a unique range of combinations of amorphous, highly disordered graphitic carbon and some randomed and ordered $sp^3$ bonded carbon. The content, or the amount, of the ordered $sp^3$ bonded carbon (i.e., diamond structure) in these films is so small that in a UV Raman spectra, with a typical instrumental operating condition, its signature Raman excitation line around 1332 $cm^{-1}$ does not appear in most cases or is less significant compared to those from $sp^2$ bonded carbon, despite the fact that the UV Raman is 25 times more sensitive to diamond/graphitic carbon ratios than conventional visible Raman spectrum (see FIGS. 1–3).

The domain size of the ordered $sp^3$ carbon is likely less than 60 angstroms judging from the FWHM and frequency shift of its Raman line (see FIG. 1). The existence of $sp^3$ bonding, particularly the amorphous $sp^3$ in these films, is more often inferred from the up frequency shift and/or a strong shoulder on the lower frequency side of the typical $sp^2$ carbon excitation line around 1580 $cm^{-1}$ as shown in FIG. 3. This shoulder can sometimes appear as a broad band between 1360 to 1410 $cm^{-1}$ with a FWHM larger than 180 $cm^{-1}$, when the 1580 $cm^{-1}$ line is not as strong. In some films, an almost typical graphitic carbon line with a slight up frequency shift and broadening appeared, indicative of little content of $sp^3$ bonded carbon and more graphitic carbon structure in the film (see FIG. 2).

Figure 10:
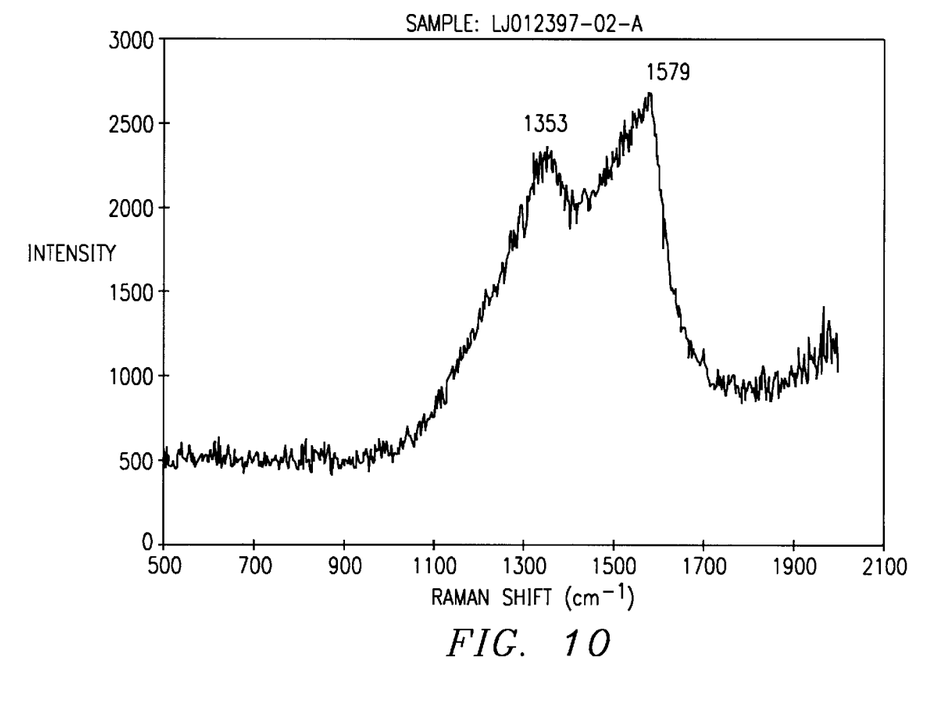
FIGS. 10–12 illustrate visible Raman spectra of the sample cathodes illustrated in FIGS. 1–3, respectively.
Figure 11:
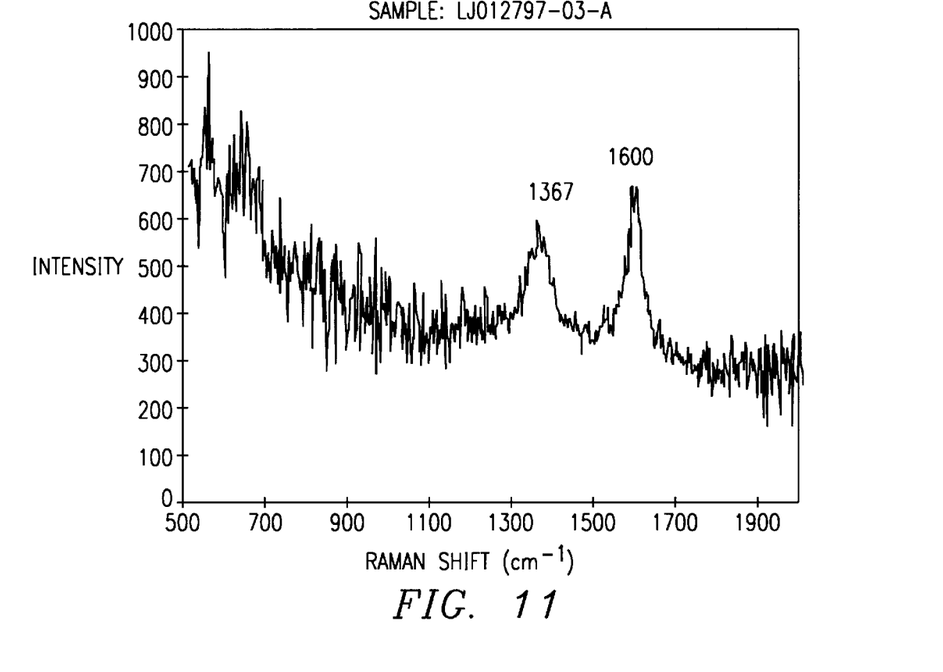
Figure 12:
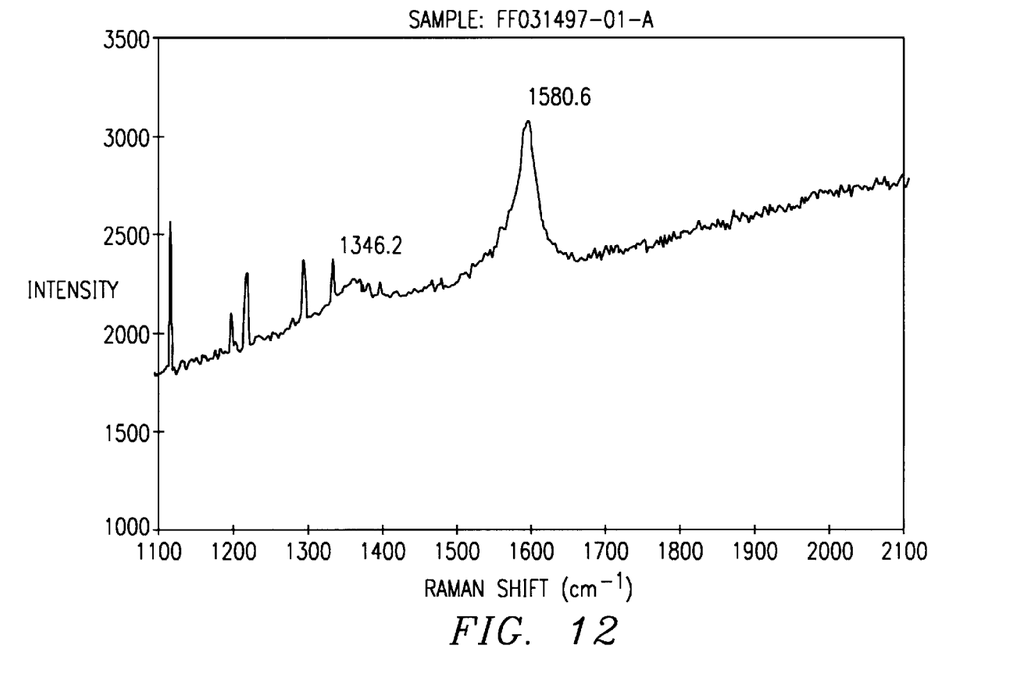

FIGS. 10–12 illustrate visible Raman spectra on the three samples illustrated with respect to FIGS. 1–3, respectively. The visible Raman spectra were produced with a 514.5 nm and 10 mW excitation source. These three Raman spectra clearly show the D/G pair of peaks at around 1350 $cm^{-1}$ (D peak) and 1580 $cm^{-1}$ (G peak). Typically, the D peak of the carbon film of the present invention will be between 1340 $cm^{-1}$ and 1380 $cm^{-1}$, while the G peak will be between 1578 $cm^{-1}$ and 1620 $cm^{-1}$.

Prior carbon films that had been reported suitable for field emission application include CVD or defect enriched CVD diamond films, such as nitrogen or boron doped or ion implanted diamond films and diamond-like carbon (DLC) films with predominantly $sp^3$ bonding. Consisting mostly of diamond bonded carbon and its domain size being much larger than 60 angstroms, CVD or defective CVD diamond films typically exhibit a dominant diamond excitation line near 1332 $cm^{-1}$ with a FWHM less than 18 $cm^{-1}$, and a broad and often much less significant band of a FWHM larger than 170 $cm^{-1}$ near 1580 $cm^{-1}$ in the UV Raman spectrum. It should be noted that although there have been reports showing that fine grained CVD diamond films sometimes have a weak or almost invisible shift around 1332 $cm^{-1}$ in the visible Raman, their UV Raman shows a strong and sharp diamond line because of the ultrasensitivity of UV Raman to the diamond/graphitic carbon ratio. In other words, the film claimed within the present invention contains less diamond structure. In most cases, its presence is completely undetectable even by UV Raman.

Figure 9:
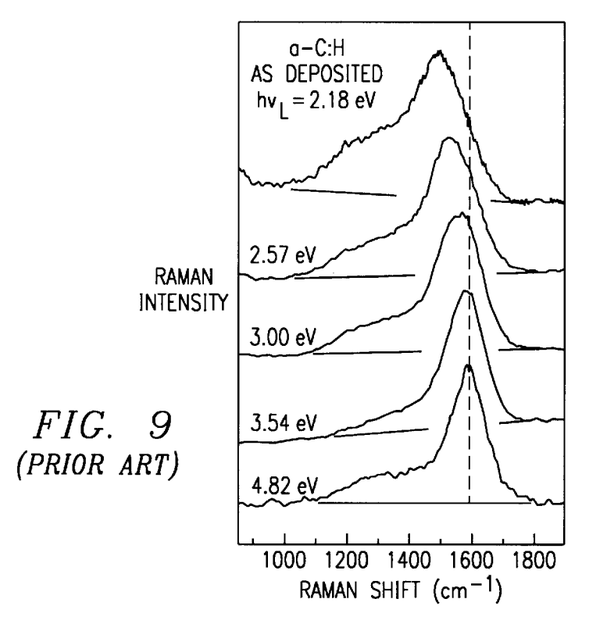
FIG. 9 illustrates a graph of a Raman spectra of a prior art DLC film.

DLC films are amorphous carbon with mixed $sp^2$ and $sp^3$ bonding. Depending on the method of making it, the $sp^3/sp^2$ bonding ratio in the film can change widely from mostly $sp^2$ to mostly $sp^3$. There has been a widely accepted assumption that there are $sp^3$ clusters in these films and that these clusters resemble diamond so that they have a negative electron affinity. Based on the above assumption, DLC films with predominantly $sp^3$ bonding have been claimed suitable for field emission application. Although the UV Raman spectra of these DLC films also exhibit an excitation line from 1580 to 1620 $cm^{-1}$, their visible Raman does not exhibit the 1580 $cm^{-1}$ line (G band) nor the 1350 $cm^{-1}$ line (D band). Instead, they have a distinct asymmetric and broad band located between 1510 to 1600 $cm^{-1}$. In addition, even in UV Raman, these predominantly $sp^3$ bonding DLC films always have another wide band or shoulder peaking at approximately 1150 $cm^{-1}$, and the FWHM of their 1580 $cm^{-1}$ lines is often larger than 165 $cm^{-1}$. This second band at 1150 $cm^{-1}$ provides another distinction between the prior art DLC films and the carbon films of the present invention. The Raman spectra of a DLC film is illustrated in FIG. 9 showing the asymmetric band located between 1510 to 1600 $cm^{-1}$ in the visible Raman, with this peak shifting to 1600 $cm^{-1}$ as the photon energy is increased to the UV Raman spectrum. Further discussion may be found within Resonant Raman Scattering of Amorphous Carbon and Polycrystalline Diamond Films, J. Wagner, M. Ramsteiner, Ch. Wild and P. Koidl, *Physical Review B*, Jul. 15, 1989, Vol. 40, pp. 1817; Ultraviolet Raman Spectroscopy Characterizes Chemical Vapor Deposition Diamond Film Growth and Oxidation, Richard W. Bornett, et al., *Journal of Applied Physics*, 77 (11), June 1995, pp. 5996; and UV Studies of Tetrahedral Bonding in Diamond-Like Amorphous Carbon, V. L.

Merkuluv, et al., *Physical Review Letters*, June 1997, pp. 4869, which are hereby incorporated by reference herein.

As discussed above, pertaining to the UV Raman spectrum, the peak position, line width, line shape, and their intensity ratios are characteristic of the bonding structure of the carbon film. The frequency and FWHM range, as well as the line shape and intensity ratio given in this invention represent a group of carbon film of ordered and disordered $sp^2$ and $sp^3$ bonding structure that has not been utilized in the prior art as a field emitter. FIGS. 1–6 show three examples of this group of carbon films that have exhibited excellent field emission properties.

The advantages of a carbon film of the present invention with the particular Raman spectra disclosed include that the film can emit at an extraction electric field lower than 2 volts per micrometer, the carbon film has an emission site density of at least $10^4$ sites/centimeter$^2$ at 10 volts per micrometer, and the carbon film can provided a current density of 100 milliamps per centimeter$^2$ or higher. The emission properties make these carbon films particularly desirable for highly uniform, high performance field emission electron devices. It should be emphasized that although there might have been reports that some prior art diamond or DLC films can emit at a comparable electrical field or deliver a current density that is comparable, there has never been a report on the emission site density of those films. In fact, often only a few emission sites have been shown and a reported emission current density is inferred from a current gathered from those few sites. The carbon film disclosed herein emits all over the surface uniformaly.

Although the present invention and its advantages have been described in detail, it should be understood that various changes, substitutions and alterations can be made herein without departing from the spirit and scope of the invention as defined by the appended claims.

What is claimed is:

1. A field emission device comprising a layer of carbon film on a substrate, wherein the carbon film has a UV Raman band in the range from 1578 cm$^{-1}$ to 1620 cm$^{-1}$, wherein the UV Raman band has a full width at half maximum ("FWHM") from 25 cm$^{-1}$ to 165 cm$^{-1}$.

2. The field emission device as recited in claim 1, wherein the UV Raman band has a shoulder or broad band between 1360 to 1420 cm$^{-1}$, with a FWHM larger than 180 cm$^{-1}$.

3. The field emission device as recited in claim 1, wherein the carbon film has a second UV Raman band in the range from 1318 to 1340 cm$^{-1}$ with a FWHM larger than 18 cm$^{-1}$ with a lower intensity than the previously recited UV Raman band in claim 1.

4. The field emission device as recited in claim 1, wherein the carbon film is less than 300 nm in thickness.

5. The field emission device as recited in claim 1, wherein the carbon film exhibits a D/G pair around 1350 cm$^{-1}$ and 1580 cm$^{-1}$ in a visible Raman spectrum.

6. A field emission display device comprising:
   an anode which includes a phosphor deposited on a substrate; and
   a cathode comprising a layer of carbon film on a substrate, wherein the carbon film has a UV Raman band in the range from 1578 cm$^{-1}$ to 1620 cm$^{-1}$ with a full width at half maximum ("FWHM") from 25 cm$^{-1}$ to 165 cm$^{-1}$.

7. The field emission display device as recited in claim 6, wherein the UV Raman band has a shoulder or broad band between 1360 to 1420 cm$^{-1}$, with a FWHM larger than 180 cm$^{-1}$.

8. The field emission display device as recited in claim 6, the carbon film has a second UV Raman band in the range from 1318 to 1340 cm$^{-1}$ with a FWHM larger than 18 cm$^{-1}$ with a lower intensity than the previously recited UV Raman band.

9. The field emission display device as recited in claim 7, wherein the carbon film is less than 300 nm in thickness.

10. The field emission cathode as recited in claim 6, wherein the carbon film exhibits a D/G pair around 1350 cm$^{-1}$ and 1580 cm$^{-1}$ in a visible Raman spectrum.

* * * * *